United States Patent [19]

Yoshioka

[11] 4,260,999
[45] Apr. 7, 1981

[54] SEMICONDUCTOR DEVICE AND METHOD OF MAKING THE SAME

[75] Inventor: Fumio Yoshioka, Sakado, Japan

[73] Assignee: Toko, Inc., Tokyo, Japan

[21] Appl. No.: 28,022

[22] Filed: Apr. 6, 1979

[30] Foreign Application Priority Data

Apr. 14, 1978 [JP] Japan .................................. 53-43970

[51] Int. Cl.³ .......................................... H01L 29/72
[52] U.S. Cl. ....................................... 357/34; 357/45; 357/48; 148/105
[58] Field of Search ............................ 357/48, 34, 45; 148/1.5 T

[56] References Cited

U.S. PATENT DOCUMENTS 4,038,680  7/1977  Yagi et al. ............................. 357/48
4,054,899  10/1977  Stehlin et al. ........................ 357/48

Primary Examiner—Edward J. Wojciechowicz
Attorney, Agent, or Firm—Schwartz, Jeffery, Schwaab, Mack, Blumenthal & Koch

[57] ABSTRACT

A semiconductor device and a method of manufacturing the same, wherein there are provided, on a semiconductor substrate of a first conductivity type, a first and a second epitaxial layer each having a second conductivity type opposite to the first conductivity type. A plurality of regions are defined in the entire area of the epitaxial layer by being isolated by means of an isolation layer of the first conductivity type which extends from the surface of the second epitaxial layer to the semiconductor substrate. Furthermore, a first buried layer of the second conductivity type is formed in each of the isolated regions in such a manner as to extend in the first epitaxial layer and semiconductor substrate so that a transistor can be formed on each first buried layer.

8 Claims, 9 Drawing Figures

SEMICONDUCTOR DEVICE AND METHOD OF MAKING THE SAME

The present invention relates to a semiconductor device including a PNP transistor and an NPN transistor which are formed on a common semiconductor substrate, and a method of manufacturing such a semiconductor device.

It has often been required that a semiconductor device include a PNP transistor and an NPN transistor, and it has been known that the collector resistance of the PNP transistor is liable to be increased due to the fact that a P type semiconductor substrate and an N type epitaxial layer are employed from a technical standpoint.

Several techniques have heretofore been proposed to decrease the collector resistance of such a PNP transistor. In a typical example of such conventional techniques, an N type epitaxial layer is formed on a P type semiconductor substrate, an isolation layer is provided in the epitaxial layer, and a PNP transistor and an NPN transistor are formed in those regions of the epitaxial layer which are isolated by the isolation layer. A first buried layer are provided in such a manner as to extend in the epitaxial layer and semiconductor substrate to thereby decrease the collector resistance of the NPN transistor. A second buried layer of a conductivity type opposite to that of the first buried layer is provided thereon, and a layer extending from the surface of the epitaxial layer to the second buried layer is provided to form the collector region of the PNP transistor, thereby decreasing the collector resistance of the PNP transistor.

With such a conventional technique, however, difficulties have been encountered in achieving the intended purpose of decreasing the collector resistance since there is the tendency that the PN junction in the epitaxial layer is formed at a considerably high or upper position so that the thickness of the second buried layer is reduced, due to the fact that the second buried layer is formed concurrently with the formation of the epitaxial layer through thermal diffusion from the surface of the semiconductor substrate so that the impurity of the first buried layer is also diffused into the epitaxial layer.

Accordingly, it is an object of the present invention to provide a semiconductor device including a PNP transistor and an NPN transistor each having a decreased collector resistance.

Another object of the present invention is to provide a method of making such a semiconductor device.

In summary, according to the present invention, a first and a second epitaxial layer each having a second conductivity type are provided on a semiconductor substrate of a first conductivity type; a plurality of regions are defined in the entire area of the epitaxial layer by being isolated by means of an isolation layer of the first conductivity type which extends from the surface of the second epitaxial layer to the semiconductor substrate; and a first buried layer of the second conductivity type is formed in each of the isolated regions in such a manner as to extend in the first epitaxial layer and semiconductor substrate so that a transistor can be formed on each first buried layer. In the PNP (NPN) transistor thus formed, the bottom PN junction thereof is located within the thickness of the first epitaxial layer; the collector region is defined by means of a second buried layer of the first conductivity type which is provided in such a manner as to extend through the second epitaxial layer and a layer of the first conductivity type which is provided in such a manner as to extend from the surface of the second epitaxial layer to the second buried layer; the base region is defined by that portion of the epitaxial layer which is surrounded by the collector region; and the emitter region is defined by that portion of the layer of the first conductivity type which is surrounded by the base region. In the NPN (PNP) transistor, the collector region is defined by the first buried layer and first and second epitaxial layers; the base region is defined by that portion of the layer of the first conductivity type which is surrounded by the collector region; and the emitter region is defined by a layer of the second conductivity type which is surrounded by the base region.

Other objects, features and advantages of the present invention will become apparent from the following description taken in conjunction with the accompanying drawings.

Figure 4A:
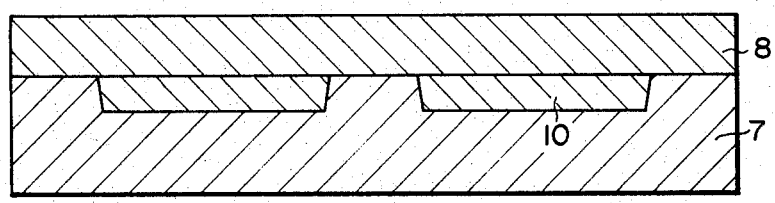

FIGS. 4A, B and C are schematic sectional views useful for explaining the various steps of the method according to the present invention.

Figure 5:
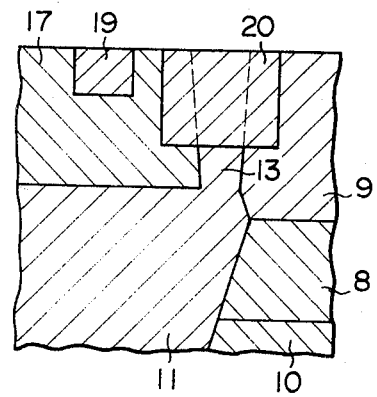

FIG. 5 is a fragmentary enlarged sectional view showing the semiconductor device according to another embodiment of the present invention.

Figure 6:
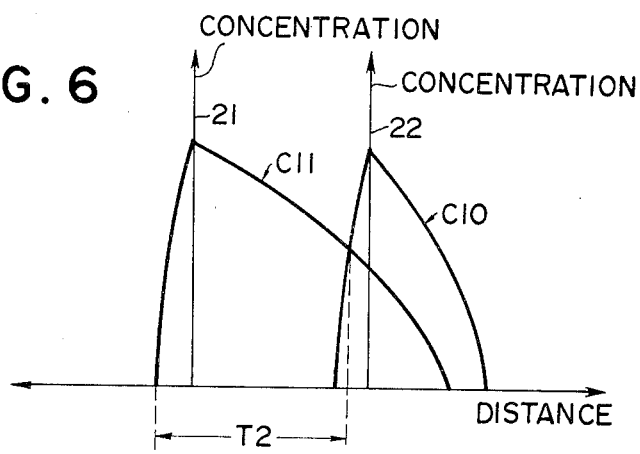

FIG. 6 is a view illustrating the distribution of impurity concentrations in the semiconductor device embodying the present invention.

In order to give a better understanding of the present invention, description will first be made of the prior-art technique with reference to FIGS. 1 and 2.

Figure 1:
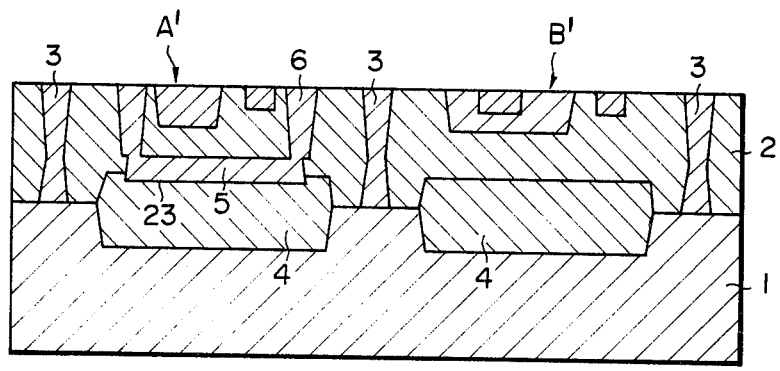
FIG. 1 is a schematic sectional view showing a prior-art semiconductor device useful for explaining the present invention.

Referring to FIG. 1, there is shown a semiconductor device comprising a P type semiconductor substrate 1 having an N type epitaxial layer 2 formed therein, the epitaxial layer 2 being isolated by means of an isolation layer 3 so that a PNP transistor A' and an NPN transistor B' are formed in the epitaxial layer 2. Furthermore, a buried layer 4, which is provided in the epitaxial layer 2 and semiconductor substrate 1, serves to decrease the collector resistance of the NPN transistor B'. Another buried layer 5 which is opposite in conductivity type to the buried layer 4, is provided in the PNP transistor A', and a layer 6 is formed therein in such a manner as to extend from the surface of the epitaxial layer 2 to the buried layer 5 to form the collector region of the transistor A'.

However, by the fact that the buried layer 5 is formed by means of thermal diffusion from the surface of the semiconductor substrate 1 when the epitaxial layer 2 is formed, impurities in the buried layer 4 also tend to be diffused into the epitaxial layer at the same time. Consequently, the PN junction in the epitaxial layer 2 occurs at a considerably high or upper position so that the thickness of the buried layer 5 is reduced, thus making it difficult to achieve the intended purpose.

Figure 2:
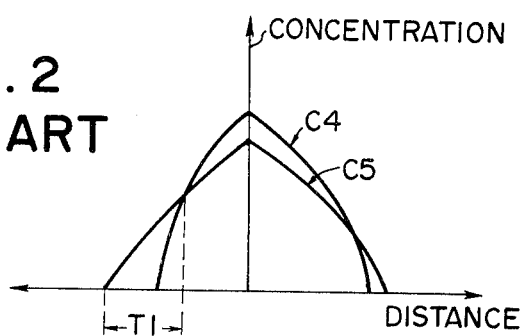
FIG. 2 is a view illustrating the distribution of impurity concentration in the semiconductor device shown in FIG. 1.

FIG. 2 illustrates the above-described situation in terms of impurities in the buried layers 4 and 5. In FIG. 2, the ordinate axis indicates the impurity concentration, and the abscissa axis represents the distance in the direction of thickness. The position of the ordinate axis on the abscissa axis corresponds to the surface of the semiconductor substrate 1; the portion on the left hand side of the ordinate axis represents the thickness of the epitaxial layer 2; and the portion on the right hand side of the ordinate axis indicates the thickness of the semiconductor substrate 1. In FIG. 2, C4 and C5 are curves showing the concentration distributions resulting from the impurities to form the buried layers 4 and 5, respectively. PN junctions occur at the positions where these two curves cross each other. The left hand side PN junction corresponds to the position indicated at 23 in FIG. 1. The buried layer 5 is constituted by a portion of a lower impurity concentration indicated by T1 in FIG. 2. With the semiconductor device of FIG. 1, difficulties are encountered in an attempt to make the impurity concentration of the buried layer 5 higher than the impurity concentration of the buried layer 4. This is due to the fact that it is necessary to prevent the buried layer 5 from substantially penetrating through the buried layer 4 since the speed of diffusion of the P type impurity to form the buried layer 5 is higher than the speed of diffusion of the N type impurity to form the buried layer 4. Thus, when it is attempted to decrease the collector resistance by making the impurity concentration of the buried layer 5 higher than the impurity concentration of the buried layer 4, it is required that the PN junction be formed at that deep position in the semiconductor substrate 1 where the buried layer 5 is prevented from penetrating through the buried layer 4. Thus, the buried layer 4 should naturally have a great thickness so that a long diffusion time is taken for the buried layer 4 to be formed.

The present invention is intended to overcome the drawbacks of the aforementioned prior art technique.

Description will now be made of preferred embodiments of the present invention with reference to FIGS. 3 to 6.

Figure 3A:
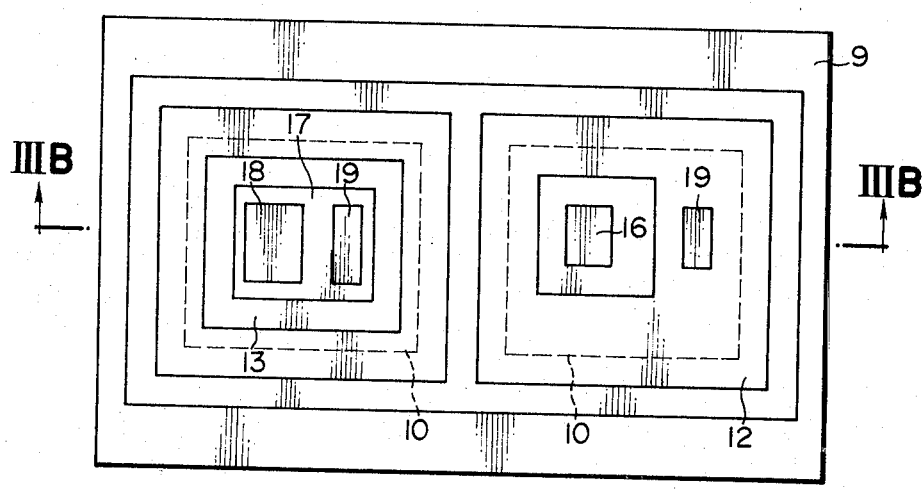
FIG. 3A is a schematic plan view showing the semiconductor device according to an embodiment of the present invention.
Figure 3B:
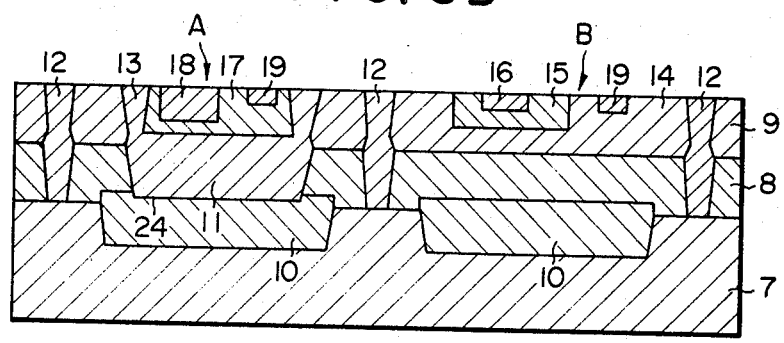
FIG. 3B is a sectional view taken along the lines III—III of FIG. 3A.

Referring to FIGS. 3A and 3B, there is shown an embodiment of the present invention. FIG. 3A is a schematic plan view of this embodiment, and FIG. 3B is a sectional view taken along the lines III—III of FIG. 3A.

As is seen from FIGS. 3A and 3B, the device of this embodiment comprises a semiconductor substrate 7 formed of P type silicon having a high resistivity, first and second epitaxial layers 8 and 9 each being of the N type and having a high resistivity, a first buried layer 10 of the N type, a second buried layer 11 of the P type, an isolation layer 12 of the P type, a PNP transistor A, and an NPN transistor B. Designated by 14, 15 and 16 are the collector, base and emitter regions of the NPN transistor B, respectively. Designated by 17 and 18 are the base and emitter regions of the PNP transistor A respectively. Each of the PNP and NPN transistors A and B is also provided with a contact region 19 and a P type layer 13. In FIGS. 3A and 3B, the insulation film covering to protect the second epitaxial layer 9 and the electrodes for ohmic connectionswith the respective regions constituting the transistors are omitted for the sake of clarity.

The first epitaxial layer 8 is formed on the semiconductor substrate 7, and the second epitaxial layer 9 is formed on the first epitaxial layer 8. The isolation layer 12 extends from the surface of the second epitaxial layer 9 to the semiconductor substrate 7, and the plural regions isolated by the isolation layer 12 are formed in the entire area of each epitaxial layer. The first buried layer 10 is formed in such a manner as to extend in the first epitaxial layer 8 and semiconductor substrate 7 in each isolated region. The PNP transistor A and NPN transistor B are formed in the first and second epitaxial layers 8 and 9 on the first buried layer 10. Though the transistors A and B are shown as formed in the isolated regions in FIGS. 3A and 3B, it is also possible that these transistors may be formed in the same region. The collector region of the PNP transistor A is constituted by a second buried layer 11 extending in the second epitaxial layer 9 and in contact with the first buried layer 10 and a layer 13 extending from the surface of the second epitaxial layer 9 to the second buried layer 11. The layer 13 takes a rectangular shape in its plan view. The base region 17 is formed by that portion of the second epitaxial layer 9 which is surrounded by the collector region, and the emitter region 18 is constituted by the layer portion surrounded by the base region 17. The NPN transistor B has its collector region 14 formed by the first buried region 10, first epitaxial layer 8 and second epitaxial layer 9 in the isolated region. The base region 15 is formed by the layer portion surrounded by the collector region 14, and the emitter region 16 is formed by the layer portion surrounded by the base region 15. A contact region 19 is provided in the surface of each of those portions of the second epitaxial layer 9 which constitute the base region 17 of the PNP transistor A and the collector region 14 of the NPN transistor B.

The method of producing the semiconductor device according to the present invention will next be described in connection with FIG. 4 which illustrates schematically in cross section the configurations of the present semiconductor device which occur during intermediate steps of the method.

Figure 4B:
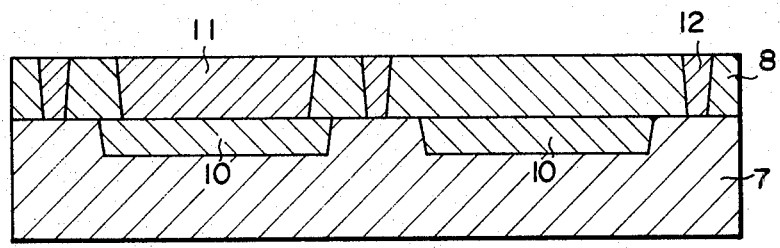
Figure 4C:
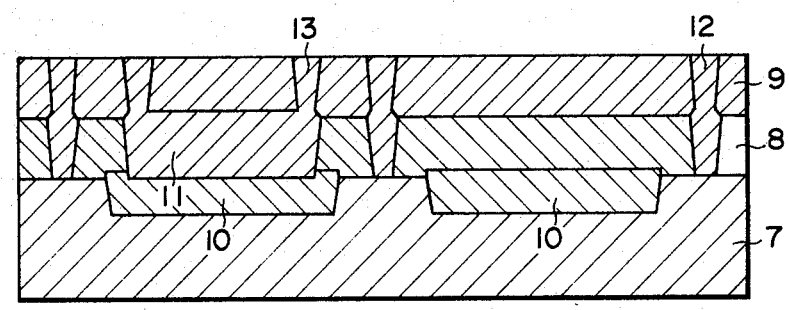

In this method, arsenic or antimony is diffused from the surface of a semiconductor substrate 7 of P type silicon having a resistivity of about 10 $\Omega$cm so as to form a first buried layer 10 which is 5 $\mu$m in thickness, 150 $\mu$m$^2$ in exposed surface area and about $2\times10^{19}$/cm$^3$ in impurity concentration. In this way, a first epitaxial layer 8 having a thickness of 5 $\mu$m and a resistivity of about 1 $\Omega$cm is formed in the surface of the semiconductor substrate 7 as shown in FIG. 4A. Thereafter, boron is diffused from the surface of the epitaxial layer 8 so that there are concurrently formed a portion of the P type isolation layer 12 which extends to the semiconductor substrate 1 and a second buried layer 11 which constitutes a portion of the collector region of the PNP transistor A, as shown in FIG. 4B. Subsequently, a second epitaxial layer 9 of the N type is formed on the first epitaxial layer 8, the epitaxial layer 9 having a resistivity and thickness substantially equal to the resistivity and thickness of the epitaxial layer 8. Then, boron is diffused from the surface of the second epitaxial layer 9 so that the remainder of the isolation layer 12 and a P type layer 13 extending as far as the second buried layer 11 are formed at the same time as shown in FIG. 4C. By this step, regions isolated by means of the isolation layer 12 are formed in the epitaxial layers 8 and 9, and the collector region of the PNP transistor in one of the isolated regions is formed at the same time. Thereafter, boron is diffused from the surface of the second epitaxial layer 9 so that a layer constituting the emitter region 18 of the PNP transistor A is formed in that portion of the second epitaxial layer 9 which is surrounded by the layer 13 while at the same a layer constituting the base region 15 of the NPN transistor B is formed in the other of the regions surrounded by the isolation layer 12. The impurity concentration which occurs in the surface of the epitaxial layer 9 when the emitter region 18 and base region 15 are formed, is about $10^{18}$–$10^{19}$/cm$^3$. Furthermore, arsenic or phosphor is diffused from the surface of the second epitaxial layer 9 so that a layer constituting a contact region 19 is formed in that portion of the second epitaxial layer 9 which surrounds the emitter region 18 of the PNP transistor A, i.e., base region, a layer constituting the emitter region 16 is formed in the base region 15 of the NPN transistor B, and a contact region 19 is formed in that portion of the second epitaxial layer 9 which surrounds the base region 15, i.e., collector region 14, all at the same time. The respective layers formed through diffusion of the first buried layer, second buried layer and so forth tend to be slightly expanded by the heat applied during each step of the process, and thus the ultimate configuration of those layers turns out to be as shown in FIG. 3B.

FIG. 5 is a fragmentary enlarged sectional view showing the semiconductor device according to another embodiment of the present invention.

The embodiment shown in FIG. 5 is different from the embodiment shown in FIGS. 3A and 3B in that the impurity concentration in that portion of the collector region which constitutes a PN junction in the vicinity of the surface of the second epitaxial layer 9 of the PNP transistor A is made lower than the impurity concentration in the remaining portion of the collector region. The portion 20 of the collector region is formed concurrently with the formation of the emitter region 18, by means of diffusion which is effected from the surface of the epitaxial layer 9 including that portion of the layer 13 which is exposed out of the surface of the epitaxial layer 9.

The portion 20 of the collector region has for its object to avoid adverse influences by surface imperfections and pile-down which tend to occur at the PN junction formed by the layer 13 of a higher impurity concentration and second epitaxial layer 9 of a lower impurity concentration.

The operational effects of the semiconductor device constructed in the above-described manner will be explained with reference to FIG. 6 which shows the distributions of impurity concentration in the first buried layer 10 and second buried layer 11.

In FIG. 6, the ordinate indicates impurity concentration, and the abscissa represents distance, as in FIG. 2. The position of the ordinate axis 21 on the abscissa axis corresponds to the surface of the first epitaxial layer 8, and the position of the ordinate axis 22 corresponds to the surface of the semiconductor substrate 7. Thus, the portion on the left hand side of the ordinate axis 21 corresponds to the thickness of the second epitaxial layer 9; the portion intermediate between the ordinate axis 21 and the ordinate axis 22 corresponds to the thickness of the epitaxial layer 8; and the portion on the right hand side of the ordinate axis corresponds to the thickness of the semiconductor substrate 7. In FIG. 6, C10 and C11 are curves showing the concentration distributions resulting from the impurities for forming the first and second buried layers 10 and 11, respectively. A PN junction is produced at a position P within the thickness portion of the epitaxial layer 8 where the two curves cross each other. The position P corresponds to the position shown by the solid line 24 in FIG. 3. The portion on the left hand side of the position P is of the P type, and the portion on the right hand side of the position P is of the N type; thus, the thickness of the second buried layer 11 is as indicated by T2 in FIG. 6. The thickness portion T2 of the second buried layer 11 includes the surface portion of the first epitaxial layer 8 of the highest impurity concentration.

A comparison of FIG. 6 with FIG. 2 which shows the impurity concentration distributions of the prior-art semiconductor device, clearly indicates that the thickness portion T2 of the second buried layer 11 has a greater thickness than the thickness portion T1 of the buried portion 5 which corresponds to the same portion of the conventional semiconductor device.

This can only be achieved by virtue of the construction of the present semiconductor device and method of making the same wherein the first epitaxial layer 8 is provided and the second buried layer 11 is formed by means of diffusion effected from the surface of the epitaxial layer 8. In addition, the resistance of the second buried layer 11 can be further decreased by the fact that the second buried layer 11 includes the surface portion of the first epitaxial layer 8 having the highest impurity concentration. Furthermore, the P type impurity to form the second buried layer 11 is diffused from the surface of the first epitaxial layer 8 which is spaced apart from the surface of the semiconductor layer 7 by a distance corresponding to the thickness of the first epitaxial layer, so that such impurity will never be permitted to penetrate through the first buried layer 10 in spite of the difference in diffusion velocity between the P type impurity and the N type impurity and despite the fact that the first buried layer 10 is formed so as to be of a reduced thickness, insofar as a PN junction is formed in the first epitaxial layer 8 by the first and second buried layers 10 and 11. In this way, the time required for the first buried layer 10 can be reduced, and yet the impurity to form the second buried layer 11 can be diffused with an increased concentration as a whole.

Furthermore, second buried layer 11 can be made sufficiently thick even if the impurity concentration thereof is reduced in order to prevent the impurity form being rediffused into the second epitaxial layer 8 during the step subsequent to the step of forming the second buried layer 11, thus resulting in the collector resistance being decreased.

Still furthermore, any leakage that tends to result from imperfections or pile-down in the PN junction formed by the layer 13 of a high impurity concentration and the second epitaxial layer 9 of a low impurity concentration, can be prevented by means of the portion 20 in the collector region of the second epitaxial layer 9 as shown in FIG. 5. It will be readily appreciated from the foregoing description that the method of making the semiconductor device according to the present invention requires no difficult techniques, and thus that the regions associated with the PNP and NPN transistors can be successively and efficiently produced. Though, in the foregoing discussion, description has been made of the case where the second buried layer 11 is formed in contact with the first buried layer 10, it is also possible that the second buried layer 12 may be formed above the first buried layer 10 without being contacted therewith so that the bottom PN junction at the position 24 of the second buried layer 11 may be formed in the first epitaxial layer 8. In summary, it is only required that the PN junction at the bottom of the second buried layer 11 be formed within the thickness portion of the first epitaxial layer 8.

The present invention is by no means limited to the aforementioned embodiments but finds use in various applications. Though, in the above-described embodiments, the P type semiconductor substrate 7 was employed to make a semiconductor device comprising a PNP transistor and an NPN transistor, it is also possible that an N type semiconductor substrate may be used to make such a semiconductor device; in such a case, too, the problems tending to arise with the resistance of the collector region which occurs in the NPN transistor can be solved by similar technical means. In the foregoing embodiments, transistors were formed in the regions isolated by means of the isolation layer 12; however, it is also possible that any other circuit element or elements such as resistor, capacitor or the like may be formed in such regions, instead of or together with the PNP and NPN transistors.

As will be appreciated from what has been described above, there are provided semiconductor devices each including PNP and NPN transistors each having the collector saturation voltage characteristic improved by reducing the collector resistance thereof.

While the present invention has been described with respect to some specific embodiments thereof, it should be understood that the present invention is not restricted thereto but various modifications and changes may be made therein without departing from the spirit and scope of the present invention as defined in the appended claims.

I claim:

1. A semiconductor device comprising a semiconductor substrate of a first conductivity type; a first and a second epitaxial layer provided on said semiconductor substrate, each of said first and second epitaxial layers being of a second conductivity type opposite to said first conductivity type; an isolation layer of the first conductivity type extending from the surface of said second epitaxial layer to said semiconductor substrate so that a plurality of regions isolated by means of said isolation layer are defined in said epitaxial layers; a first buried layer of said second conductivity type on which a transistor is formed in at least one of said regions; a PNP (NPN) transistor having a collector region comprising a second buried layer of the first conductivity type and a layer of the first conductivity type extending from the surface of said second epitaxial layer to said second buried layer, said second buried layer extending as far as the second epitaxial layer and having a PN junction formed at the bottom thereof, said PN junction being provided in contact with said first buried layer within the thickness of said first epitaxial layer, a base region defined by that portion of said second epitaxial layer which is surrounded by said collector region, and an emitter region defined by layer of the first conductivity type surrounded by the base region; as NPN (PNP) transistor comprising a collector region defined by said first buried layer and said first and second epitaxial layers, a base region defined by layer of the first conductivity type surrounded by the collector region, and an emitter region defined by layer of the second conductivity type surrounded by the base region.

2. A semiconductor device according to claim 1, wherein the impurity concentration in the collector region of the PNP (NPN) transistor forming a PN junction in the vicinity of the surface of the second epitaxial layer is made lower than that in the other collector region.

3. A semiconductor device according to claim 1 or 2, wherein a PNP transistor and a circuit element or elements other than transistor are formed in at least one of the regions isolated by said isolation region.

4. A semiconductor device according to claim 1 or 2, wherein an NPN transistor and a circuit element or elements other than transistor are formed in at least one of the regions isolated by said isolation layer.

5. A semiconductor device according to claim 1 or 2, wherein a PNP transistor and an NPN transistor are formed in at least one of the regions isolated by said isolation region.

6. A semiconductor device according to claim 1 or 2, wherein a PNP transistor, an NPN transistor and a circuit element or elements other than transistor are formed in at least one of the regions isolated by said isolation layer.

7. A method of manufacturing a semiconductor device, comprising the steps of:
    forming in a semiconductor substrate of a first conductivity type a plurality of first buried layers of a second conductivity type opposite to said first conductivity type;
    forming a first epitaxial layer of the second conductivity type on said semiconductor substrate;
    forming, at the same time, an isolation layer of the first conductivity type extending as far as the semiconductor substrate and a second buried layer of the first conductivity type constituting a portion of the collector region of a PNP (NPN) transistor, by means of diffusion from the surface of said first epitaxial layer;
    forming on said first epitaxial layer a second epitaxial layer of the same conductivity type as that of said first epitaxial layer;
    forming, at the same time, a layer of the first conductivity type extending as far as the second buried layer to constitute a portion of the collector region of the PNP (NPN) transistor and an isolation layer extending as far as said isolation layer formed in said first epitaxial layer, by means of diffusion from the surface of said second epitaxial layer, thereby forming the collector region of the PNP (NPN) transistor and a base region thereof which is surrounded by said collector region;
    forming, at the same time, an emitter region of said PNP (NPN) transistor in said base region and a base region of an NPN (PNP) transistor in the second epitaxial layer surrounded by the isolation layer, by means of diffusion from the surface of the second epitaxial layer; and
    forming an emitter region in the base region of said NPN (PNP) transistor.

8. A method as set forth in claim 7, wherein in that portion where the layer of the first conductivity type constituting a portion of the collector region of the PNP (NPN) transistor is exposed to the surface of the second epitaxial layer, another portion of the collector region is formed at the same time, during the step of forming, at the same time, the emitter of the PNP (NPN) transistor in the base region thereof and the base region of the NPN (PNP) transistor in the second epitaxial layer surrounded by the isolation layer, by means of diffusion from the surface of the second epitaxial layer.

* * * * *